US010608618B1

(12) United States Patent
Ekambaram et al.

(10) Patent No.: US 10,608,618 B1
(45) Date of Patent: Mar. 31, 2020

(54) METHOD AND APPARATUS FOR WIDE RANGE VOLTAGE TRANSLATION

(71) Applicant: Xilinx, Inc., San Jose, CA (US)

(72) Inventors: Sabarathnam Ekambaram, Hyderabad (IN); Milind Goel, Hyderabad (IN); Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/022,206

(22) Filed: Jun. 28, 2018

(51) Int. Cl.
  *H03K 3/00* (2006.01)
  *H03K 3/356* (2006.01)
  *H03K 19/017* (2006.01)

(52) U.S. Cl.
  CPC . *H03K 3/356113* (2013.01); *H03K 19/01707* (2013.01)

(58) Field of Classification Search
  CPC ............ H03K 3/356113; H03K 19/01707
  See application file for complete search history.

(56) References Cited

U.S. PATENT DOCUMENTS

| 5,300,832 A * | 4/1994 | Rogers ............ H03K 3/356113 326/57 |
| 6,970,024 B1* | 11/2005 | Reese ............ H03K 3/356113 327/112 |
| 8,994,412 B2* | 3/2015 | Kim ................ H03K 3/356165 327/109 |
| 9,859,894 B1* | 1/2018 | Chou ............ H03K 19/018528 |
| 2005/0258864 A1* | 11/2005 | Chen ............... H03K 3/356113 326/81 |
| 2016/0211847 A1* | 7/2016 | Duby ............... H03K 3/35613 |
| 2018/0287615 A1* | 10/2018 | Pan ................. H03K 19/17784 |

* cited by examiner

*Primary Examiner* — Alexander H Taningco
*Assistant Examiner* — Kurtis R Bahr
(74) *Attorney, Agent, or Firm* — Patterson + Sheridan, LLP

(57) ABSTRACT

A method, non-transitory computer readable medium, and circuit for wide range voltage translation using monostable multi-vibrator feedback are disclosed. The circuit includes a bias generation segment and a voltage translator to shift a voltage level of a signal from a first voltage domain of a digital system to a second voltage domain of the digital system. The bias generation segment is configured to detect a voltage range of the second voltage domain and to configure the voltage translator responsive to the voltage range. The voltage translator is configured to directly shift the voltage level of the signal to the second voltage domain. The second voltage domain has voltage levels that are higher than a maximum voltage that can be tolerated by transistors in the digital system.

19 Claims, 5 Drawing Sheets

US 10,608,618 B1

METHOD AND APPARATUS FOR WIDE RANGE VOLTAGE TRANSLATION

TECHNICAL FIELD

The present disclosure generally relates to the field of digital circuits and more particularly relates to voltage level translation.

BACKGROUND

It is not unusual for different portions (e.g., different devices) of a digital system, such as a high-speed general-purpose input/output (GPIO), to operate from different power supply voltages. In such a case, when a signal crosses from a first voltage domain of the digital system to a second voltage domain of the digital system (e.g., from a lower voltage device to a higher voltage device), a voltage level shifter may be used to shift (or translate) the signal's voltage level so that there is reliable signal translation without power contention.

SUMMARY

A method, non-transitory computer readable medium, and circuit for wide range voltage translation using monostable multi-vibrator feedback are disclosed. The circuit includes a bias generation segment and a voltage translator to shift a voltage level of a signal from a first voltage domain of a digital system to a second voltage domain of the digital system. The bias generation segment is configured to detect a voltage range of the second voltage domain and to configure the voltage translator responsive to the voltage range. The voltage translator is configured to directly shift the signal to the second voltage domain. The second voltage domain has voltage levels that are higher than a maximum voltage that can be tolerated by transistors in the digital system.

In another example, the circuit includes a bias generation segment and a voltage translator to shift a voltage level of a signal from a first voltage domain of a digital system to a second voltage domain of the digital system. The bias generation segment is configured to detect a voltage range of the second voltage domain and to configure a voltage translator responsive to the voltage range. The voltage translator is configured to directly shift the signal to the second voltage domain and further includes an input receiving sub-segment, a stress minimization sub-segment, a contention minimization sub-segment, and a feedback generation sub-segment. The input receiving sub-segment is configured to receive the signal. The stress minimization sub-segment is connected to the input receiving sub-segment and is configured to minimize stress on transistors of the voltage translator during switching. The contention minimization sub-segment is connected to the input receiving sub-segment and is configured to minimize contention among the transistors of the voltage translator during switching. The input receiving sub-segment, the stress minimization sub-segment, and the contention minimization sub-segment are collectively arranged to form a first leg and a second leg parallel to the first leg. The feedback generation sub-segment is connected to the contention minimization sub-segment and is configured to provide a plurality of feedback signals to the second leg.

In another example, the method includes receiving a signal from a first voltage domain of a digital system. The signal is directly shifted from the first voltage domain to a second voltage domain of the digital system, to produce a voltage shifted signal. The second voltage domain has voltage levels that are higher than a maximum voltage that can be tolerated by transistors in the digital system.

Other features will be recognized from consideration of the detailed description and the claims.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION

Figure 1:
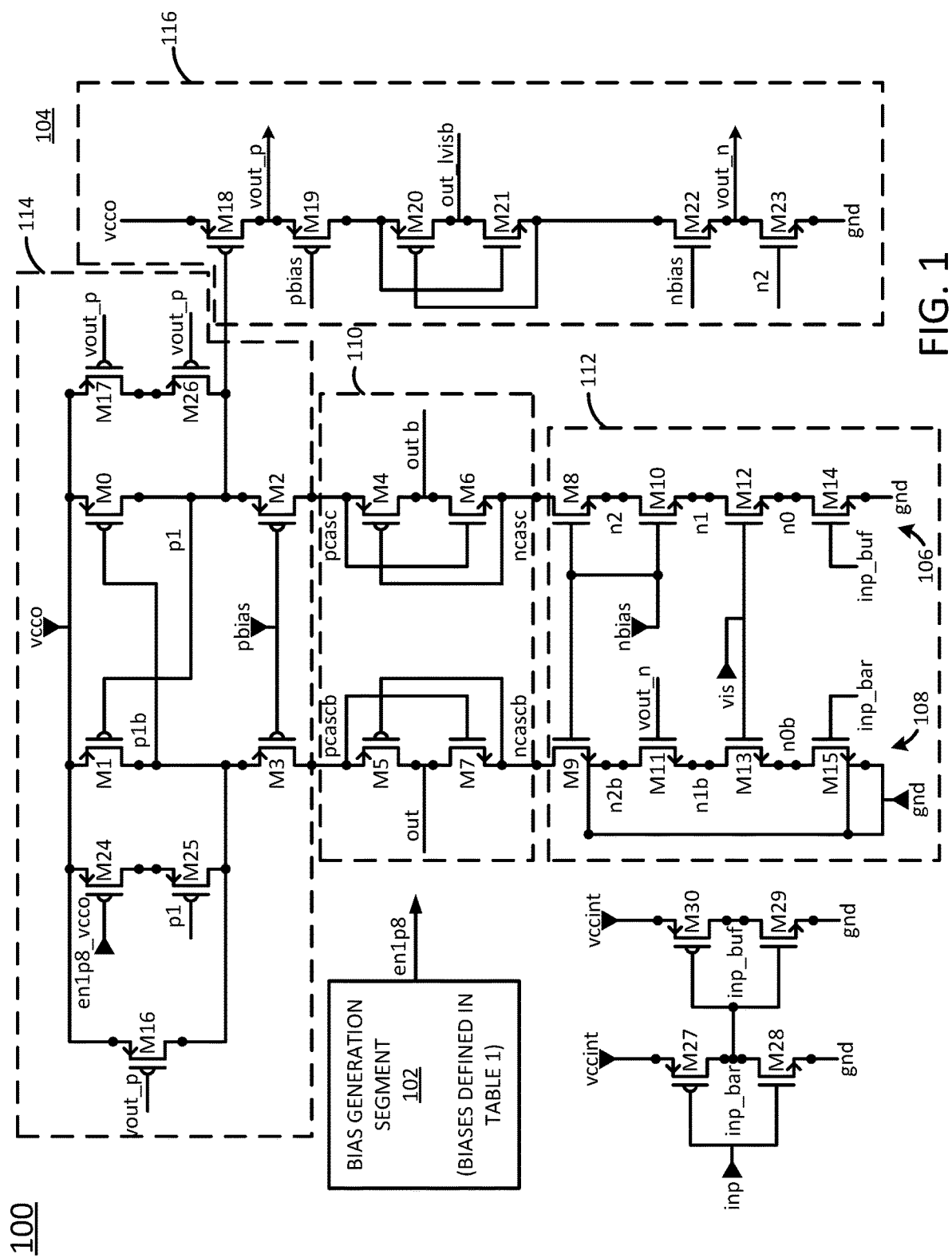
FIG. 1 illustrates an example circuit for voltage translation.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

The present disclosure broadly discloses a method, non-transitory computer readable medium, and a circuit for wide range voltage translation using monostable multi-vibrator feedback. As discussed above, it is not unusual for different portions (e.g., different devices) of a digital system, such as a high-speed GPIO, to operate from different power supply voltages. In such a case, when a signal crosses from a first voltage domain of the digital system to a second voltage domain of the digital system (e.g., from a lower voltage device to a higher voltage device), a voltage level shifter may be used to shift (or translate) the signal's voltage level so that there is reliable signal translation without power contention.

Traditionally, large voltage level shifts (i.e., shifts of greater than the maximum voltage that can be tolerated by the transistors) have been performed in two stages using multiple separate voltage level shifters. For instance, one voltage level shifter may be used to shift from an internal supply voltage level, vccint (which may range from 0.65 volts to 0.925 volts) to an intermediate auxiliary supply voltage level, vccaux (which may be approximately 1.8 volts), using a first data path. Subsequently, another voltage level shifter in series may be used to shift from the intermediate auxiliary supply voltage level to an output driver supply voltage level, vcco (which may range from 1.2 volts to 3.3 volts). Thus, where vcco is less than or equal to 1.8 volts, a first level shifter constituting a single data path may be used. However, where vcco is greater than 1.8 volts, two level shifters in series are needed, and this constitutes another data path. The need for multiple voltage level shifters and multiple data paths increases the overall area consumed by the voltage level shifter circuit in the digital system. With as many as five instances of a voltage level shifter per I/O, and as many as five hundred I/Os per chip, such a configuration can easily cause a great deal of area to be consumed on an integrated circuit chip.

One example of the present disclosure provides wide range voltage translation, i.e., voltage translation from a first voltage domain directly to a second voltage domain in a single stage without a shift to an intermediate auxiliary supply voltage domain, where the second voltage domain may have voltage levels that are higher than a maximum voltage that can be tolerated by the transistors in a digital system (e.g., 1.89 volts). For instance, examples of the disclosure are capable of shifting a voltage from as low as 0.65 volts to a variable supply voltage (e.g., 1.2 volts to 3.3 volts) in a single stage and using a single data path. In some examples, the wide range voltage translation is achieved using a monostable multivibrator feedback technique, which functions as an asymmetric voltage level shifter. Not only does the disclosed voltage level shifter consume less area than conventional two-stage voltage level shifters (e.g., as much as twenty-five percent less area), but it also consumes less power (e.g., as much as twelve percent less average power, and as much as fifty percent less peak and root mean square power). Power sequencing is also simplified as the disclosed voltage level shifter uses fewer power supplies (e.g., two supplies versus three).

Within the context of the present disclosure, a "wide range" voltage translation refers to an ability to shift a voltage level by an amount that is greater than the maximum voltage that can be tolerated by the transistors in a digital system (e.g., 1.89 volts in one example). However, examples of the present disclosure are also capable of performing smaller voltage shifts using the same circuitry.

Moreover, within the context of the present disclosure, a voltage "domain" refers to a partition of a device or a digital system that operates at a different supply voltage relative to other partitions of the device or system. A digital device or system may comprise a plurality of voltage domains operating at different supply voltages.

FIG. 1 illustrates an example circuit 100 for voltage translation. The circuit 100 may be a portion of a digital system, such as a high-speed general-purpose input/output (GPIO). As discussed above, the circuit 100 shifts a voltage from a first voltage domain directly to a second voltage domain, without a shift to an intermediate auxiliary supply voltage domain. In one example, the circuit 100 generally includes bias generation segment 102 and a wide range voltage translator 104.

In one example, each of the bias generation segment 102 and the wide range voltage translator 104 comprises a plurality of 1.89 volt I/O transistors (i.e., transistors for which the voltage difference between any two terminals cannot exceed 1.89 volts) and a plurality of 0.925 volt core transistors (i.e., transistors for which the voltage difference between any two terminals cannot exceed 0.925 volts). These transistors are not shown for the bias generation segment, which may be configured in any manner that is capable of providing the appropriate bias voltages (discussed in further detail below) to the wide range voltage translator 104. Within the wide range voltage translator 104, the 1.89 volts I/O transistors are denoted by M0-M13 and M16-M26, while the 0.925 volt core transistors are denoted by M14-M15 and M27-M30.

In one example, the bias generation segment 102 generates an enable signal (en1p8_aux, en1p8_b_vcco, en1p8_vcco, pbias, nbias, and/or vis) that detects the output driver supply voltage vcco (i.e., the voltage range of the voltage domain to which a signal is to be shifted) and configures the wide range voltage translator 104 in response to the output driver supply voltage vcco. For instance, if the bias generation segment 102 determines that vcco is greater than 1.8 volts, the bias generation segment 102 may configure the wide range voltage translator 104 for a high voltage mode of operation. However, if the bias generation segment 102 determines that vcco is less than or equal to 1.8 volts, the bias generation segment 102 may configure the wide range voltage translator 104 for a low voltage mode of operation.

Conventional I/O transistors cannot support more than 1.89 volts across their terminals (i.e., gate-drain, gate-source, and drain-source); thus when vcco is higher than 1.8 volts (e.g., 2.5 volts or 3.3 volts), the bias generation segment 102 will generate a bias voltage to restrict the voltage difference between any two nodes of a transistor to less than 1.89 volts. This is the high voltage mode of operation. Table 1, below illustrates a plurality of example bias voltages and enable signals with respect to vcco for the high voltage (i.e., vcco>1.8V, e.g., vcco=2.5V or 3.3V) and low voltage (i.e., vcco≤1.8V, e.g., vcco=1.2V, 1.5 V, or 1.8V) modes of operation of the circuit 100.

TABLE 1

| Bias voltages and enable signals | | | | | | |
|---|---|---|---|---|---|---|
| Voltage condition | en1p8_aux | en1p8_b_vcco | pbias | nbias | vis | en1p8_vcco |
| vcco > 1.8 V | 0 | vcco | vcco - 1.8 | 1.8 | 1 | pbias |
| vcco ≤ 1.8 V | vcco | 0 | 0 | vcco | 1 | vcco |

The wide range voltage translator 104 comprises a plurality of sub-segments that perform different functions. In one example, these sub-segments comprise a stress minimization sub-segment 110, an input receiving sub-segment 112, a contention minimization sub-segment 114, and a feedback generation sub-segment 116.

In one example, the stress minimization sub-segment 110 is configured to minimize stress on the transistors of the wide range voltage translator 104 during switching. In one example, the stress minimization sub-segment 110 comprises transistors M4, M5, M6, and M7, which may be connected back-to-back to minimize the stress (e.g., by reducing hot carrier injection). This arrangement may also help to ensure that the signals ncasc and ncascb reach a maximum value of 3.3−vtn (NMOS threshold voltage of the I/O transistors), while the signals pcasc and pcascb reach a minimum value of vtp (PMOS threshold voltage of the I/O transistors) only when the signals out and outb switch rail-to-rail.

In one example, the input receiving sub-segment 112 is connected directly to the stress minimization sub-segment 110 and is configured to receive an input signal inp, which may represent an output signal from a first voltage domain of a digital system including the circuit 100 (where the voltage level of the output signal may not match an input voltage range of a second voltage domain of the digital system to which the output signal is to be forwarded). In the input receiving sub-segment 112, buffered and inverted versions of the input signal, i.e., inp_buf and inp_bar, are received by core transistors (e.g., transistors M14 and M15). The input signal is buffered and inverted by the transistors M27, M28, M29, and M30. In one example, the input receiving sub-segment 112 comprises transistors M8, M9, M10, M11, M12, M13, M14, and M15.

In one example, the transistors M8, M9, M10, M11, M12, M13, M14, and M15 are configured to form an n-type section of the circuit 100 that protects the NMOS transistors against high voltages (e.g., 3.3 volts). Conventionally, core transistors such as M14 and M15 cannot withstand more than 0.925 volts across any of their two terminals, and I/O transistors such as M8-M13 cannot withstand more than 1.89 volts across any of their two terminals.

The input receiving sub-segment 112 may not directly interface with I/O transistors, as the threshold voltage of I/O devices is approximately 650 millivolts, and at least the internal supply voltage vccint of the circuit 100 can go as low as approximately 650 millivolts. However, the transistors M12 and M13 may be I/O transistors, which can tolerate voltage differences of up to the maximum voltage supported by the transistors (e.g., in some examples 1.89 volts). In one example, the signals n0 and n0b are held to below 0.925 volts by biasing the vis signal to approximately one volt to protect the core transistors M14 and M15. In one example, the transistors M8, M9, M10, M11, M12, and M13 may be protected by biasing the nbias signal at 1.8 volts.

In one example, the contention minimization sub-segment 114 is also connected directly to the stress minimization sub-segment 110 and is configured to minimize contention while switching. In one example, the contention minimization sub-segment 114 comprises transistors M0, M1, M2, M3, M16, M17, M24, M25, and M26, which are configured to form a p-type section of the circuit 100. In one example, the transistors M2 and M3 may be biased at pbias to ensure that nodes p1 and p1b operate in safe conditions. The transistors M0, M1, M2, and M3 may provide regenerative feedback. In one example, the regenerative feedback is designed to avoid creating contention while switching, due to feedback from an output stage of the feedback generation sub-segment 116 (described below). To this end, in one example, the transistor M1 is designed to be x times weaker than the transistor M0 (where, in one example, x=5).

Collectively the stress minimization sub-segment 110, the input receiving sub-segment 112, and the contention minimization sub-segment 114 may be arranged to form a first "leg" (or first plurality of transistors) and a parallel second "leg" (or second plurality of transistors) of the wide range voltage translator 104. For instance, the first leg 106 may comprise transistors M0, M2, M4, M6, M8, M10, M12, M14, M17, and M26, while the second leg 108 may comprise transistors M1, M3, M5, M7, M9, M11, M13, M15, M16, M24, and M25.

In one example, the feedback generation sub-segment 116 is positioned laterally from the stress minimization sub-segment 110, the input receiving sub-segment 112, and the contention minimization sub-segment 114 (e.g., is not part of the first leg 106 or the second leg 108), and comprises transistors M18, M19, M20, M21, M22, and M23. Collectively, the transistors M18, M19, M20, M21, M22, and M23 form a high voltage inverter for providing monostable multivibrator feedback to the first leg 106 and second leg 108 of the wide range voltage translator 104.

In one example, the feedback generation sub-segment 116 generates a plurality of feedback signals, including vout_p and vout_n. The feedback signal vout_p may be provided as feedback to the transistors M16, M17, and M26 of the contention minimization sub-segment 114, while the feedback signal vout_n may be provided as feedback to the transistor M11 of the input receiving sub-segment 112. The feedback signals vout_p and vout_n cause the second leg 108 of the wide range voltage translator 104 to operate as a monostable multivibrator and reduce the contention of the circuit 100. The monostable multivibrator will have one stable state and one quasi-stable state, which cause the monostable multivibrator to function as an asymmetric level shifter. In this case, the input signal inp is a trigger, the feedback signal vout_p swings from the output driver supply voltage vcco to pbias, and the feedback signal vout_n swings from nbias to zero (where pbias and nbias are defined as above in Table 1).

Within the context of the present disclosure, the definition of a "low" voltage level or a "high" voltage level may depend on whether the wide range voltage translator 104 is operating in a low voltage mode of operation or a high voltage mode of operation. Table 2, below, illustrates one example of how voltage levels may be defined for various signals based on different modes of operation of the wide range voltage translator 104 (where low voltage mode is defined by a vcco≤1.8 V and high voltage mode is defined by vcco>1.8 V, e.g., vcco=3.3V or 2.5V).

TABLE 2

Voltage levels and signals based on modes of operation

| Voltage Levels | Signals | | |
| --- | --- | --- | --- |
| | inp | Low voltage mode: vout_p & vout_n | High voltage mode: vout_p & vout_n |
| Low | 0 | 0 | vout_p = pbias + vtp vout_n = 0 |
| High | 0.65-0.925 V | 1.2-1.8 V | vout_p = vcco vout_n = nbias − vtn |

Figure 2:
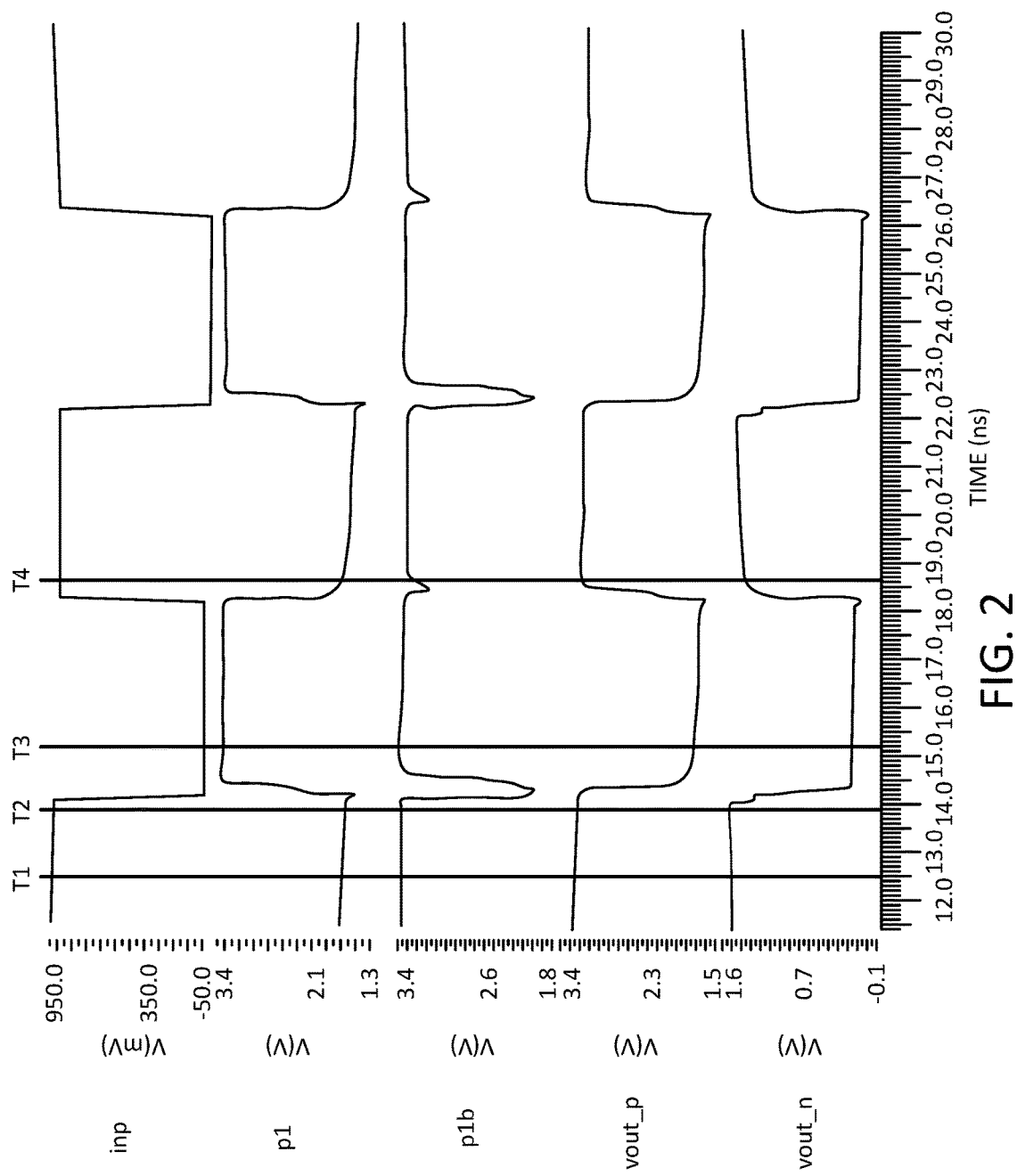
FIG. 2 illustrates an example timing diagram of the circuit of FIG. 1 operating in a high voltage mode.

FIG. 2 illustrates an example timing diagram of the circuit 100 of FIG. 1 operating in a high voltage mode (e.g., where vcco is 3.3 volts or 2.5 volts). Time T1 in FIG. 2 represents a set of initial conditions for the circuit 100. At time T1, the input signal inp (which, in this case, is also the internal supply voltage vccint) is one, and the inverted input signal, inp_bar, is zero. The core transistor M14 in the first leg 106 of the wide range voltage translator 104 is on, and the core transistor M15 in the second leg 108 of the wide range voltage translator 104 is off.

In the first leg 106 of the wide range voltage translator 104, nodes n0, n1, n2 of the input-receiving sub-segment 112, and ncasc of the stress minimization sub-segment 110 get pulled down to zero. This, in turn, sets node p1 in the contention minimization sub-segment 114 to pbias+vtp. While p1=pbias+vtp, transistor M1 is on, but weak. This holds node p1b in the contention minimization sub-segment 114 at vcco (at time T1, p1*b* is already at vcco due to monostable multivibrator feedback). Transistor M0 is off. Since p1 is greater than or equal to pbias+vtp, transistor M18 in the feedback generation sub-segment 116 is turned on. Thus, the feedback signal vout_p generated by the feedback generation sub-segment 116 is set to vcco, and feedback signal vout_n generated by the feedback generation sub-segment 116 is set to nbias−vtn. Transistor M11 of the input receiving sub-segment 112 is on.

In the second leg 108 of the wide range voltage translator 104, node p1*b* of the contention minimization sub-segment 114 is equal to pcascb, which is equal to vcco. Node ncascb of the stress minimization sub-segment 110 is equal to vcco−vtn. Node n2*b* of the input receiving sub-segment 112 is equal to nbias−vtn. Node n1*b* is equal to vout_n−vtn (where vtn is the NMOS threshold voltage of an I/O transistor in the circuit 100, as discussed above). Node n0*b* is equal to vis−vtnc (where vtnc is the NMOS threshold voltage of a core transistor in the circuit 100). The inverted input signal, inp_bar, is zero.

When the input signal inp transitions from high to low, as shown from time T2 to time T3 in FIG. 2, monostable multivibrator feedback is triggered. As the inverted input signal inp_bar reaches the NMOS threshold voltage, vtnc, of the core transistor M15 in the second leg 108 of the wide range voltage translator 104, the core transistor M15, which was previously off, turns on. As the core transistor M15 turns on, it pulls the nodes n0*b* and n1*b* of the input receiving sub-segment 112 to greater than or equal to zero. The node n2*b* follows the node n1*b* to zero.

At this point, in a conventional voltage level shifter, contention would arise between the transistors M1 and M15 in the second leg 108 of the wide range voltage translator 104 due to regenerative feedback. However, since the transistor M1 is x times weaker than the transistor M0 in the first leg 106, this ensures that the contention is reduced by x times, which improves switching. As such, in one example, the node ncascb of the stress minimization sub-segment 110 is easily pulled to zero, and the node p1*b* of the contention minimization sub-segment 114 is pulled to pbias+vtp, i.e., a quasi-stable state, with minimized contention.

With the node ncascb pulled to zero and the node p1*b* pulled to pbias+vtp, the transistor M0 of the first leg 106, which is approximately x times stronger than the transistor M1 of the second leg 108, turns on. When the transistor M0 turns on, the node p1 of the contention minimization sub-segment 114 is quickly pulled up to vcco, and the node n2 of the input receiving sub-segment 112 is quickly pulled up to nbias−vtn. The core transistor M14 in the first leg 106 of the wide range voltage translator 104, which was previously turned on at time T1, is turned off.

With the node p1 pulled to at least vcco and the node n2 pulled to at least nbias−vtn, the feedback signal vout_n generated by the feedback generation sub-segment 116 sets to greater than or equal to zero, and the feedback signal vout_p generated by the feedback generation sub-segment 116 sets to greater than or equal to pbias+vtp. At this point, the transistor M1 in the second leg 108 of the wide range voltage translator 104 turns off.

Feedback from the feedback signal vout_p (which is greater than or equal to pbias+vtp) causes the transistors M16, M17, and M26 to turn on. With the feedback signal vout_n set to greater than or equal to zero, the transistor M11 in the input receiving sub-segment 112 turns off. This cuts off the input path in the second leg 108 of the wide range voltage translator 104, i.e., the input trigger is cut off so that the circuit 100 enters a quasi-stable state. At the same time, with the transistor M16 now on, the node p1*b* of the contention minimization sub-segment 114 is pulled back up to vcco (i.e., monostable multivibrator feedback pulls the node p1*b* back up to its stable state).

Thus, during the transition from time T2 to time T3, there is reduced contention between the relatively weak transistor M1 and the core transistor M15 in the second leg 108 of the wide range voltage translator 104, which pulls the node p1*b* of the contention minimization sub-segment 114 down to a logic zero. Conversely, the node p1*b* is pulled back up to its stable state (vcco) by the transistor M16 (which is a relatively strong transistor) after the input transition path is cut off by the transistor M11 shutting off.

Monostable multivibrator feedback also ensures that the relatively strong transistor M0 of the contention minimization sub-segment 114 turns off quickly and that the relatively weak transistors M17 and M26 are turned on (maintaining the node p1 at vcco). Thus, a strong switching device (e.g., the transistor M0) is replaced with weak "holding" devices (e.g., the transistors M17 and M26) to reduce contention during the next voltage transition. This sets the conditions for the circuit 100 to make the next input transition (i.e., from digital low to digital high).

When the input signal inp transitions from digital low to digital high, as shown from time T3 to time T4 in FIG. 2, the core transistor M14 in the first leg 106 of the wide range voltage translator turns on, while the core transistor M15 in the second leg 108 turns off. The transistor M11 in the second leg 108 is still off as discussed above. Thus, there is contention between the core transistor M14 of the input receiving sub-segment 112 with the transistors M17 and M26 to pull the node p1 of the contention minimization sub-segment 114 down to logic zero. But since the transistors M17 and M26 are relatively weak, the contention is reduced, and the node p1 can be quickly switched to greater than or equal to pbias+vtp.

The nodes n0, n1, n2, and ncasc in the first leg 106 of the wide range voltage translator are all greater than or equal to zero at this time. The node pcascb is equal to vtp. With the node p1 at least equal to pbias+vtp, the relatively weak transistor M1 in the second leg 108 of the wide range voltage translator 104 turns on, as does the transistor M18 of the feedback generation sub-segment 116. With the node n2 at zero, the transistor M23 of the feedback generation sub-segment 116 turns off.

Thus, the signal feedback vout_p generated by the feedback generation sub-segment 116 is less than or equal to vcco, and the feedback signal vout_n generated by the feedback generation sub-segment 116 is equal to nbias−vtn. With the feedback signal vout_p set less than or equal to vcco, the transistor M16 turns off. Conversely, with the feedback signal vout_n set to nbias−vtn, the transistor M11 in the second leg 108 of the wide range voltage translator 104 turns on. This sets the conditions for the next input trigger, which will trigger monostable multivibrator feedback.

Thus, the feedback from the outputs (e.g., the feedback signals vout_p and vout_n generated by the feedback generation sub-segment 116) act to isolate regenerative feedback devices from creating contention with NMOS, by ensuring that contention always happens between a weak PMOS device and a strong NMOS device. This speeds up the positive feedback (regeneration) of the circuit 100 by as many as x times (where, in one example, x=5), thereby improving performance.

Moreover, voltages may be shifted directly from the low voltage (e.g., vccint) domain to the high voltage (e.g., vcco)

domain, without an intermediate voltage domain shift and with all reliability specifications being met. The circuit 100 may therefore consume as much as twenty-five percent less area than conventional level shifters which employ an intermediate level shift.

Figure 3A:
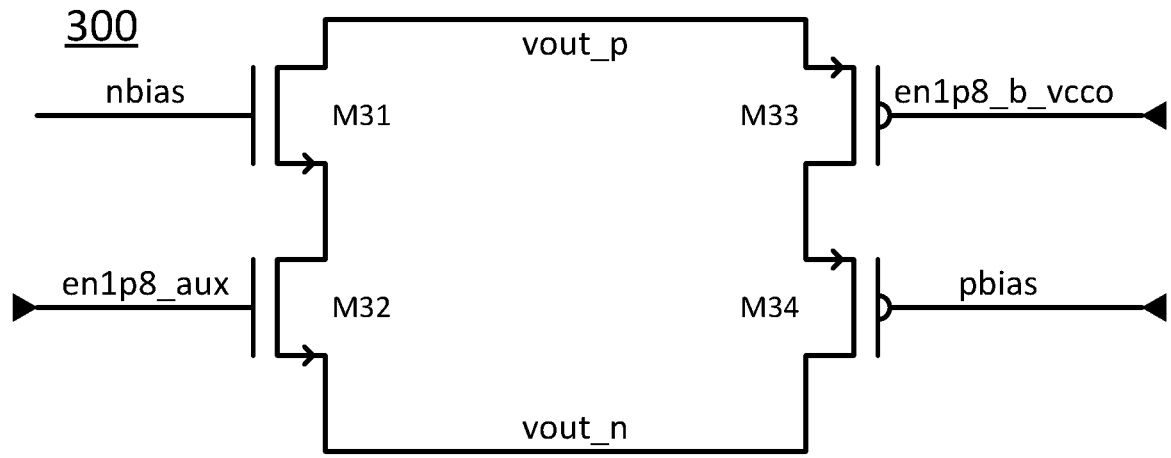
FIG. 3A illustrates a transmission gate structure that may be added to short the nodes vout_p and vout_n of FIG. 1 in a low voltage mode of operation.
Figure 3B:
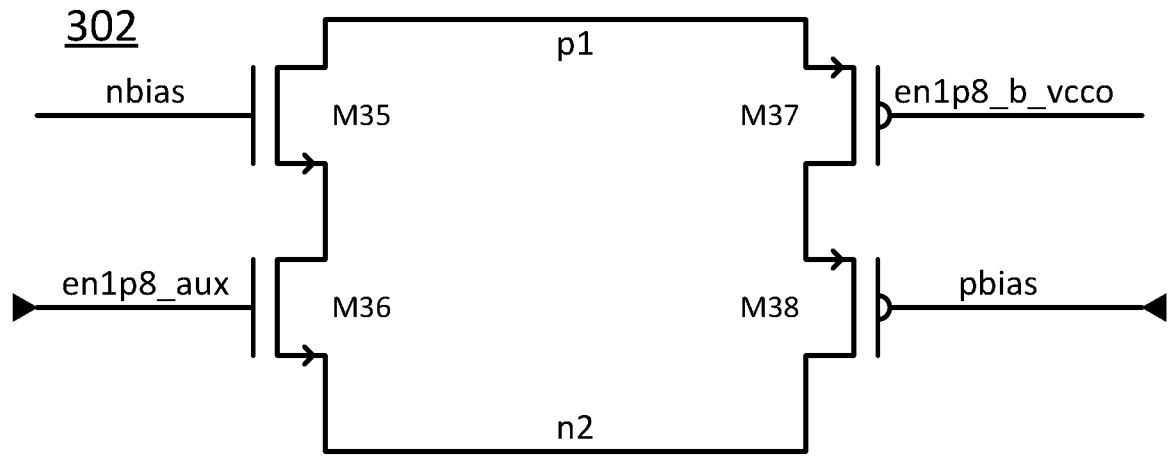
FIG. 3B illustrates a transmission gate structure that may be added to short the nodes p1 and n2 of FIG. 1 in a low voltage mode of operation.
Figure 3C:
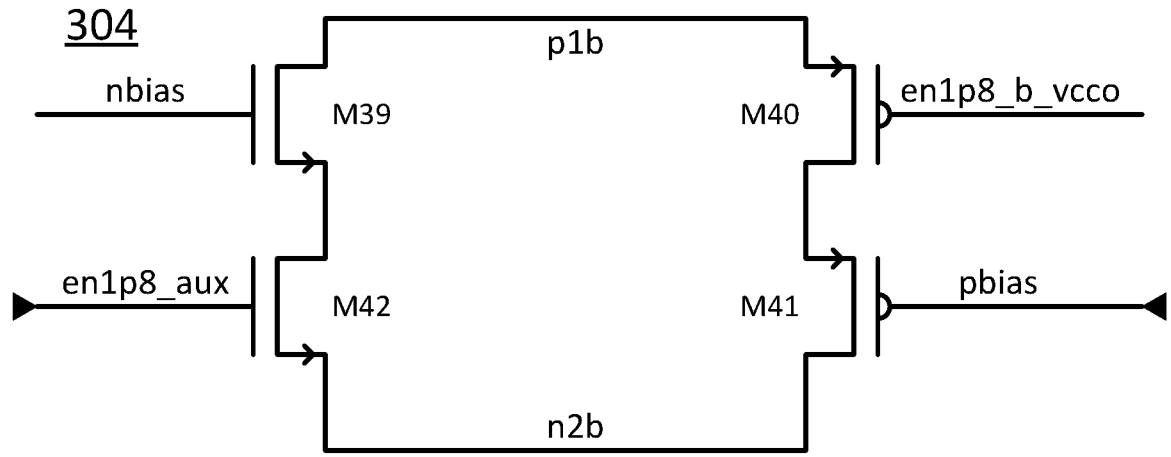
FIG. 3C illustrates a transmission gate structure that may be added to short the nodes p1*b* and n2*b* of FIG. 1 in a low voltage mode of operation.

The circuit 100 operates in a similar manner in the low voltage mode of operation (e.g., where vcco is 1.2, 1.5, or 1.8 volts, and the voltage level of an input signal is to be shifted from the vccint voltage domain to the vcco voltage domain). However, in one example, the circuit 100 includes some additional circuitry to bypass the mechanisms discussed above that protect the transistors from high voltages, since those high voltages will not be seen by the transistors when the circuit 100 is operating in the low voltage mode. For instance, FIG. 3A illustrates a transmission gate structure 300 that may be added to short the nodes vout_p and vout_n of FIG. 1 in a low voltage mode of operation; FIG. 3B illustrates a transmission gate structure 302 that may be added to short the nodes p1 and n2 of FIG. 1 in a low voltage mode of operation; and FIG. 3C illustrates a transmission gate structure 304 that may be added to short the nodes p1$b$ and n2$b$ of FIG. 1 in a low voltage mode of operation.

In one example, when the second voltage domain (vcco) is less than or equal to 1.8 volts, the transmission gate structures 300, 302, and 304 turn on. The transmission gate structures 300, 302, and 304 give full swing (i.e., zero to 1.8 volts) to all nets in the circuit 100 in the low voltage mode of operation. The control signals for the transmission gate structures 300, 302, and 304 are en1$p$8_$b$_vcco and en1$p$8_aux. The values of these control signals, as well as the values of the bias and enable signals for the transmission gate structures 300, 302, and 304, are shown above in Table 1.

Figure 4:
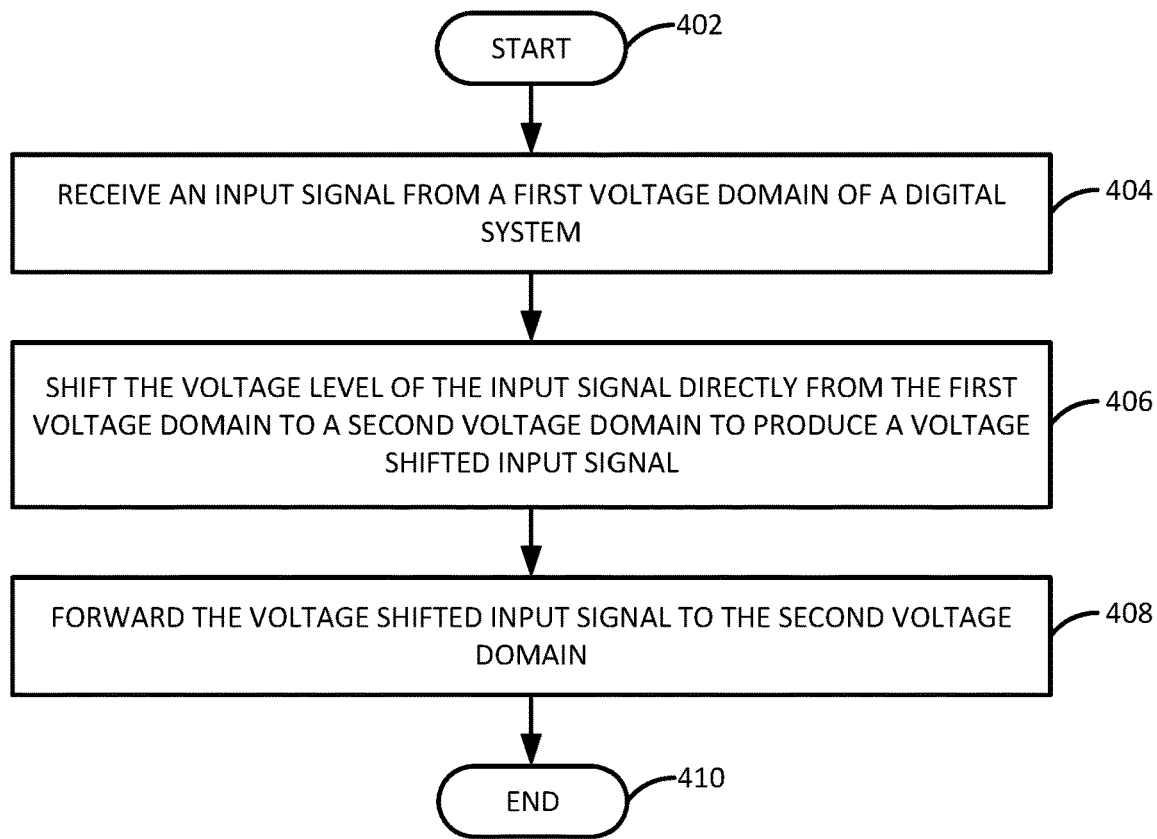
FIG. 4 illustrates a flowchart of an example method for performing voltage translation.
Figure 5:
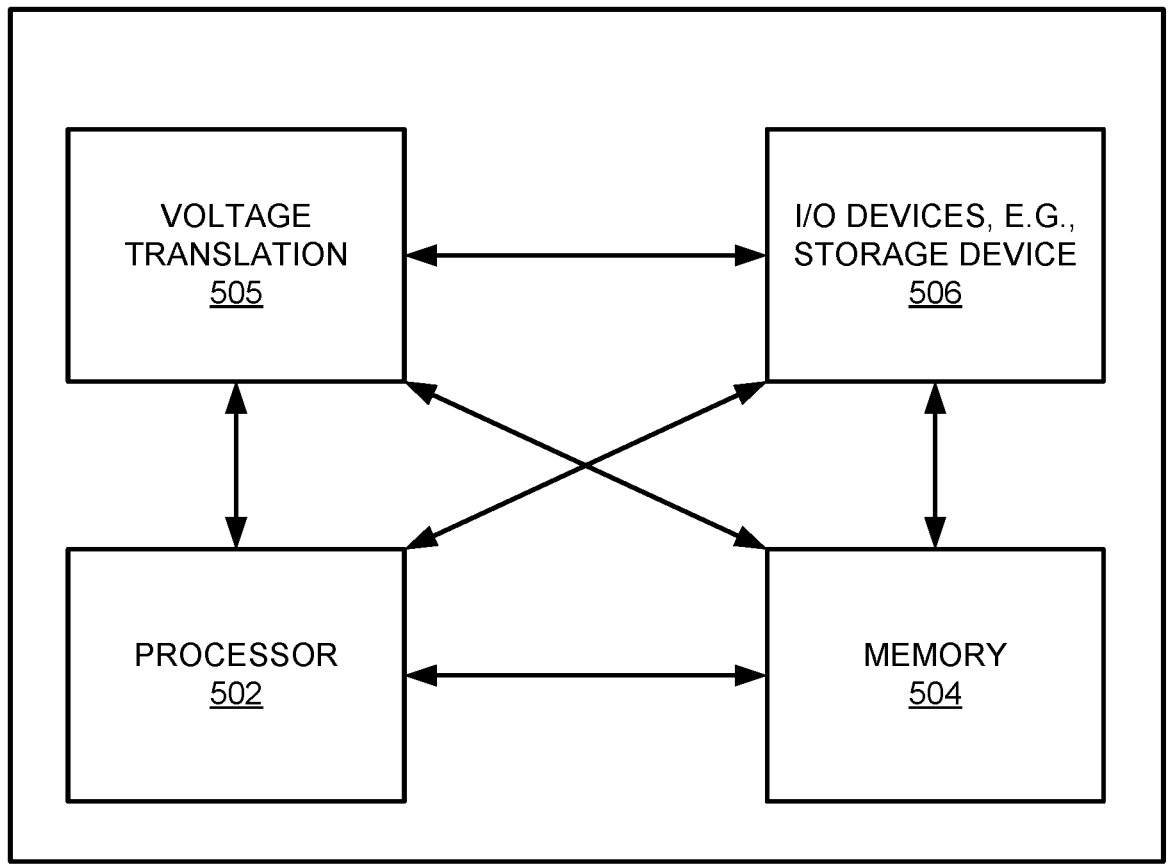
FIG. 5 illustrates a high-level block diagram of an example computing device specifically programmed for use in performing the functions described herein.

FIG. 4 illustrates a flowchart of an example method 400 for performing voltage translation. In one embodiment, the method 400 may be performed by components of the circuit 100 as illustrated in FIG. 1 or by a processor of a computing device as illustrated in FIG. 5 and discussed below. For the purposes of explanation, reference may be made in the discussion of the method 400 to various elements of the circuit 100 illustrated in FIG. 1; however, the method 400 could be performed by a circuit or device having a configuration that differs from the configuration illustrated in FIG. 1.

The method 400 begins in step 402. In step 404, a signal is received from a first voltage domain of a digital system. The signal may be an output signal of the first voltage domain. The digital system may be a high speed GPIO.

In step 406, the voltage level of the signal is shifted directly from the first voltage domain to a second voltage domain, to produce a voltage shifted signal, i.e., without performing a shift to an intermediate voltage domain (i.e., a voltage domain between the first voltage domain and the second voltage domain). In other words, the voltage level of the signal is shifted to the second voltage domain using a single voltage level shifter and a single data path. In one example, the shift is accomplished in step 406 using a monostable multivibrator feedback technique, which functions as an asymmetric voltage level shifter.

The shift may match the voltage level of the signal to a voltage range of the second voltage domain. In one example, the second voltage domain may have voltage levels that are higher than a maximum voltage that can be tolerated by the transistors of the digital system.

In one example, the input voltage range of the second voltage domain is higher than the output voltage range of the first voltage domain, necessitating a shift of the signal from a "low" voltage to a "high" voltage. For instance, the voltage of the signal received in step 404 may be at least 0.6 volts (or, more precisely, in the range of 0.65 volts to 0.925 volts), while the voltage of the voltage shifted signal produced in step 406 may be in the range of 1.2 volts to 3.3 volts.

In step 408, the voltage shifted signal is forwarded to an input of the second voltage domain.

The method 400 then ends in step 410.

It should be noted that although not explicitly specified, one or more steps, blocks, or functions of the method 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks, or functions in FIG. 4 that recite a determining operation, or involve a decision, do not necessarily require that both branches of the determining operation be practiced. In other words, one of the branches of the determining operation can be deemed as an optional step.

FIG. 5 depicts a high-level block diagram of an example computing device specifically programmed for use in performing the functions described herein. As depicted in FIG. 5, the system 500 comprises a hardware processor element (e.g., a CPU) or a hardware memory controller 502, a memory 504, e.g., random access memory (RAM) and/or read only memory (ROM), a module 505 for single-stage voltage translation and various input/output devices 506, e.g., any type of storage device, an output port, an input port and any number of interfaces.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or functions of the above disclosed method. In one example, the present module or process 505 for single-stage voltage translation can be loaded into memory 504 and executed by hardware processor/controller 502 to implement the functions as discussed above. As such, the present process 505 for single-stage voltage translation as discussed above in method 400 (including associated data structures) of the present disclosure can be stored on a non-transitory (e.g., tangible or physical) computer readable storage medium, e.g., RAM memory, magnetic or optical drive or diskette and the like.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A circuit for shifting a voltage level of a signal from a first voltage domain of a digital system to a second voltage domain of the digital system, the circuit comprising:
   a bias generation segment to detect a voltage range of the second voltage domain and to configure a voltage translator responsive to the voltage range; and
   the voltage translator to directly shift the voltage level of the signal to the second voltage domain, wherein the second voltage domain has voltage levels that are

11 higher than a maximum voltage that can be tolerated by transistors in the digital system; the voltage translator comprising:
a contention sub-segment configured to mitigate contention among the transistors of the voltage translator during switching; and
a feedback generation sub-segment connected to the contention sub-segment to provide a plurality of feedback signals to a leg of the contention sub-segment.

2. The circuit of claim 1, wherein the voltage translator is to shift the voltage level from the first voltage domain to the second voltage domain directly without performing a shift to an intermediate voltage domain that is between the first voltage domain and the second voltage domain.

3. The circuit of claim 1, wherein the bias generation segment generates a bias voltage that restricts a voltage difference between any two nodes of any one transistor of the voltage translator to less than the maximum voltage that can be tolerated by the transistors when the second voltage domain is detected to be greater than the maximum voltage that can be tolerated by the transistors.

4. The circuit of claim 1, wherein the voltage translator comprises:
an input receiving sub-segment to receive the signal;
a stress sub-segment connected to the input receiving sub-segment to minimize stress on transistors of the voltage translator during switching; and
the contention sub-segment coupled to the input receiving sub-segment.

5. The circuit of claim 4, wherein the input receiving sub-segment, the stress sub-segment, and the contention sub-segment are collectively arranged to form:
first leg; and
a second leg parallel to the first leg.

6. The circuit of claim 5, wherein the contention sub-segment comprises:
a first transistor and a second transistor located in the first leg;
and a third transistor and a fourth transistor located in the second leg, wherein the third transistor is weaker than the first transistor,
wherein the first transistor, the second transistor, the third transistor, and the fourth transistor are arranged to collectively provide regenerative feedback during switching.

7. The circuit of claim 1, wherein the feedback generation sub-segment comprises a plurality of input/output transistors arranged to form an inverter.

8. The circuit of claim 1, wherein the plurality of feedback signals causes the second leg to operate as a monostable multivibrator when the voltage level of the signal transitions.

9. The circuit of claim 8, wherein the monostable multivibrator has one stable state and one quasi-stable state.

10. The circuit of claim 1, further comprising:
a transmission gate to short nodes of the voltage translator when a voltage level of the second voltage domain is less than or equal to the maximum voltage that can be tolerated by the transistors in the digital system.

11. The circuit of claim 1, wherein the circuit is part of a general-purpose input/output.

12. A circuit for shifting a voltage level of a signal from a first voltage domain of a digital system to a second voltage domain of the digital system, the circuit comprising:

12 a bias generation segment to detect a voltage range of the second voltage domain and to configure a voltage translator responsive to the voltage range; and
the voltage translator to directly shift the voltage level of the signal to the second voltage domain, wherein the voltage translator comprises:
an input receiving sub-segment to receive the signal;
a stress sub-segment connected to the input receiving sub-segment to minimize stress on transistors of the voltage translator during switching;
a contention sub-segment coupled to the input receiving sub-segment to minimize contention among the transistors of the voltage translator during switching, wherein the input receiving sub-segment, the stress sub-segment, and the contention sub-segment are collectively arranged to form a first leg and a second leg parallel to the first leg; and a feedback generation sub-segment connected to the contention sub-segment to provide a plurality of feedback signals to the second leg.

13. The circuit of claim 12, wherein the second voltage domain has voltage levels that are higher than a maximum voltage that can be tolerated by the transistors in the digital system.

14. The circuit of claim 12, further comprising:
a transmission gate to short nodes of the voltage translator when a voltage level of the second voltage domain is less than or equal to the maximum voltage that can be tolerated by the transistors in the digital system.

15. A method, comprising:
receiving a signal from a first voltage domain of a digital system;
detecting a voltage range of a second voltage domain of the digital system; and
responsive to the voltage range, shifting, using a voltage translator, a voltage level of the signal directly from the first voltage domain to the second voltage domain, to produce a voltage shifted signal, wherein the second voltage domain has voltage levels that are higher than a maximum voltage that can be tolerated by transistors in the digital system, wherein the voltage translator comprises:
a contention sub-segment configured to mitigate contention among transistors of the voltage translator during switching; and
a feedback generation sub-segment connected to the contention sub-segment to provide a plurality of feedback signals to a leg of the contention sub-segment.

16. The method of claim 15, wherein the shifting is performed without performing a shift to an intermediate voltage domain that is between the first voltage domain and the second voltage domain.

17. The method of claim 15, wherein the voltage translator comprises:
an input receiving sub-segment to receive the signal;
a stress sub-segment connected to the input receiving sub-segment to minimize stress on transistors of the voltage translator during switching; and
the contention sub-segment connected to the input receiving sub-segment to minimize contention among the transistors of the voltage translator during switching, wherein the input receiving sub-segment, the stress sub-segment, and the contention sub-segment are collectively arranged to form a first leg and a second leg parallel to the first leg.

18. The method of claim 17, wherein the shifting comprises:
- detecting that the signal is transitioning from a digital high to a digital low; triggering a monostable multivibrator feedback in the second leg by turning on a first transistor in the input receiving sub-segment in the second leg;
- minimizing contention between the first transistor and a second transistor in the contention sub-segment in the second leg;
- and generating a first feedback signal in the feedback generating sub-segment that cuts off an input path in the second leg.

19. The method of claim 18, wherein the shifting further comprises:
- detecting that the signal is transitioning from the digital low to the digital high;
- turning off the first transistor, while turning on a third transistor in the input receiving sub-segment in the second leg;
- minimizing contention between the third transistor and a fourth transistor and a fifth transistor in the contention sub-segment in the second leg; and
- generating a second feedback signal in the feedback generating sub-segment that opens the input path in the second leg.

* * * * *